(12) United States Patent
Zhang

(10) Patent No.: US 10,047,434 B2
(45) Date of Patent: Aug. 14, 2018

(54) METHOD FOR PREPARING ULTRA-LONG-TUBE TYPE FINE-GRAIN MOLYBDENUM TUBE TARGET

(71) Applicant: KEWEI MOLYBDENUM AND TUNGSTEN CO., LTD, Luoyang (CN)

(72) Inventor: Lingjie Zhang, Luoyang (CN)

(73) Assignee: KEWEI MOLYBDENUM AND TUNGSTEN CO., LTD, Henan, Luoyang (CN)

( * ) Notice: Subject to any disclaimer, the term of this patent is extended or adjusted under 35 U.S.C. 154(b) by 432 days.

(21) Appl. No.: 14/759,547

(22) PCT Filed: Jun. 19, 2014

(86) PCT No.: PCT/CN2014/080307
§ 371 (c)(1),
(2) Date: Jul. 7, 2015

(87) PCT Pub. No.: WO2015/192356
PCT Pub. Date: Dec. 23, 2015

(65) Prior Publication Data
US 2016/0177437 A1   Jun. 23, 2016

(51) Int. Cl.
*B22F 3/24* (2006.01)
*C23C 14/34* (2006.01)
(Continued)

(52) U.S. Cl.
CPC ........... *C23C 14/3414* (2013.01); *B22F 3/16* (2013.01); *B22F 3/17* (2013.01); *C22C 27/04* (2013.01);
(Continued)

(58) Field of Classification Search
None
See application file for complete search history.

(56) References Cited

U.S. PATENT DOCUMENTS

| 8,900,340 B2 * | 12/2014 | Abenthung | C23C 14/3414 148/423 |
| 9,506,141 B2 * | 11/2016 | Oh | H01L 31/022425 |
| 2008/0193798 A1 * | 8/2008 | Lemon | B22F 3/162 428/698 |

FOREIGN PATENT DOCUMENTS

| CN | 101259584 | 9/2008 |
| CN | 102266943 | 12/2011 |

(Continued)

OTHER PUBLICATIONS

International Search Report issued in the corresponding International Application No. PCT/CN2014/080307, dated Mar. 2, 2015, 7 pages.

*Primary Examiner* — Jessee R Roe
*Assistant Examiner* — Ngoclan T Mai
(74) *Attorney, Agent, or Firm* — Hamre, Schumann, Mueller & Larson, P.C.

(57) ABSTRACT

A method for preparing an ultra-long-tube type fine-grain molybdenum tube target uses molybdenum powder with the purity being greater than 3N to prepare a target tube with a uniform wall thickness, where the length is 1700-2700 mm; the diameter is greater than 150 mm; and the wall thickness is 15-40 mm. The method includes: taking molybdenum powder, feeding the molybdenum powder into a film, molding by static pressing, placing in a medium frequency furnace, performing hydrogen sintering to form a tube blank, placing into a mold, forging the mold of a tube target, placing into tempering furnace, annealing, forming fine-grain structures, fine processing, washing, and drying to prepare a molybdenum tube target. The method overcomes defects of a sintering process and a forging process, and relates to simple processes, easy industrial production and control, reduced pollution, reduced cost, improved quality, and remarkably improved production efficiency.

3 Claims, 1 Drawing Sheet

(51) Int. Cl.
  *B22F 3/16* (2006.01)
  *B22F 3/17* (2006.01)
  *C22C 27/04* (2006.01)
  *H01J 37/34* (2006.01)
  *B22F 1/00* (2006.01)
  *B22F 5/10* (2006.01)

(52) U.S. Cl.
  CPC ......... *H01J 37/3491* (2013.01); *B22F 1/0011* (2013.01); *B22F 1/0014* (2013.01); *B22F 5/106* (2013.01); *B22F 2003/175* (2013.01); *B22F 2003/248* (2013.01); *B22F 2201/013* (2013.01); *B22F 2301/20* (2013.01); *B22F 2304/15* (2013.01); *B22F 2998/10* (2013.01); *B22F 2999/00* (2013.01)

(56) References Cited

FOREIGN PATENT DOCUMENTS

| | | |
|---|---|---|
| CN | 102277558 | 12/2011 |
| CN | 102699329 | 10/2012 |
| CN | 102699627 | 10/2012 |
| JP | 2006028536 | 2/2006 |
| JP | 2014034684 | 2/2014 |
| JP | 2015162263 | 9/2015 |
| TW | 200702471 | 1/2007 |

\* cited by examiner

METHOD FOR PREPARING ULTRA-LONG-TUBE TYPE FINE-GRAIN MOLYBDENUM TUBE TARGET

CROSS REFERENCE TO RELATED APPLICATIONS

This application is a national application of PCT/CN2014/080307. The contents of PCT/CN2014/080307 are all hereby incorporated by reference.

BACKGROUND

Technical Field

The present invention relates to a sputtering tube target used for coating a substrate of a photovoltaic element, and in particular, to a method for preparing an ultra-long-tube type fine-grain molybdenum tube target made of pure molybdenum powder.

Related Art

Currently, sputtering tube targets at home and abroad for coating a substrate of a photovoltaic element are mainly made of a tungsten material, where the product specifications thereof are all small tube targets, the lengths are all less than 1700 mm, and the wall thicknesses are all greater than 40 mm. The compactness of a tungsten spin-coated sputtering tube target is relatively small during a sputtering coating process. Therefore, when bombardment is performed on a sputtering target, air in pores inside the target is released suddenly, causing the spattering of large-sized target particles or microparticles, or when secondary electron bombardment is performed on a film after the film is formed, the spattering of microparticles is caused. In addition, during the sputtering, target atoms would be easily preferentially sputtered out along the most compact arrangement direction of six directions of the atoms. Defects of physical properties of the material of a tungsten product directly affect a service performance of a coated film.

In order to change and overcome the defects and realize the maximum sputtering rate, a general practice is changing crystal structures of a target to increase the sputtering rate. In order to reduce air pores in a solid target and improve performances of a film, some practices adopt increasing the thickness of the target to improve the quality of the coated film.

At abroad, in order to improve the quality and effect of a tube target in coating a substrate of a photovoltaic element, a molding process of extruding or drawing is usually adopted. In order to overcome defects of the extruding or drawing process, an over-sintering process and a forging molding process are adopted, including steps of: high-temperature sintering-decreasing the temperature-increasing the temperature again and then forging-low-temperature annealing-fine processing. For example, in the technical solution of CN patent application 201110242640X, when molding is performed on a tungsten material, after high-temperature sintering, a water circulation temperature decreasing treatment needs to be adopted. Moreover, for example, in two technical solutions of CN patent application 2012100007317 and CN patent application 201210000729X, when a molybdenum material is processed, both of the two technical solutions adopt a process that needs a water circulation temperature decreasing treatment after high-temperature sintering. Although the processing methods of the process are helpful in increasing the compactness of a material, the processing methods of the process cannot form fine-grain structures.

Besides, there is another substantial defect in the prior art, that is, during a forging process, directly forging the surface of a tube blank is adopted, and the deformation amount of the material during the forging is uncontrollable. Therefore, the forging method substantially affects the formation and quality of fine-grain structures.

Moreover, in the prior art, the temperatures for annealing all adopt low temperatures, and the temperatures for annealing are all in the range of 450-500° C. The temperature for annealing is too low, and therefore, the formation of fine-grain structures of a product is substantially destroyed and the quality of the product is affected.

The processes of the prior art are complex, which causes relatively poor quality, increased cost, poor tube target compactness, and large grain size. As a result, when a film is coated, the uniformity and the layout quality of the film are substantially reduced, thereby failing to meet impedance ratio and film stress requirements of a material for a solar photovoltaic product.

SUMMARY

The purpose of the present disclosure is to overcome the shortcomings of the aforementioned technical problems. A tube target is made of a molybdenum material instead of a tungsten material. The process is changed, so as to enable molybdenum powder to form fine-grain structures during a sintering process and a forging process, thereby improving the quality of the tube target and reducing the production cost. The prepared tube target is of an increased length (the length is 1700-2700 mm), an increased diameter (the diameter is greater than 150 mm), and a decreased wall thickness (the wall thickness is 15-40 mm), and using the product can substantially improve the efficiency of coating a substrate of a photovoltaic element and ensure the service life of the product.

In order to overcome the shortcomings of the aforementioned technical problems, the present disclosure adopts the following technical solution: a method for preparing an ultra-long-tube type fine-grain molybdenum tube target uses molybdenum powder with the purity being greater than 3N to prepare a target tube with a uniform wall thickness, where the length is 1700-2700 mm; the diameter is greater than 150 mm; and the wall thickness is 15-40 mm. The preparation method includes:

(1) taking molybdenum powder having a granularity of 2.8-3.8 mm, feeding the molybdenum powder into a film prepared in advance, molding by static pressing under 160-200 Mpa, placing in a medium frequency furnace, sintering for 55-65 h under hydrogen protection at 1900-2000° C., sintering to form a tube blank, keeping the temperature, and reserving for use;

(2) taking the sintered tube blank from the medium frequency furnace, placing in a mold prepared in advance, controlling the temperature of the tube blank to be 1350° C., forging the mold of a tube target, controlling the deformation amount of the tube blank to be less than 50% during the forging, and forging to form a tube target with the length being 1700-2700 mm, the diameter being greater than 150 mm, and the wall thickness being 15-40 mm;

(3) taking the tube target formed by forging, placing in a tempering furnace of 1000-1200° C., annealing for 1-3 h, and stabilizing formed fine-grain structures; and (4) performing fine processing on the tube target, then washing, and drying to prepare the fine-grain molybdenum tube target.

In order to obtain an ultra-long-tube type fine-grain tube target made of molybdenum instead of tungsten, the keys of the present disclosure lie in overcoming the defect caused by using water to perform a temperature decreasing treatment after high-temperature sintering, overcoming the defect of directly forging the surface of a tube blank during the forging and failing to control the deformation amount of the forging, overcoming the defect caused by low-temperature annealing, and changing the low-temperature annealing to high-temperature annealing, so as to form fine-grain structures for the tube target, improve the quality, reduce the process steps, and reduce the cost.

In the method for preparing an ultra-long-tube type fine-grain molybdenum tube target of the present disclosure, the sintering may be vacuum sintering, and the method for controlling the temperature of the vacuum sintering is: gradually increasing the temperature from 0° C. to 2000° C.

In the method for preparing an ultra-long-tube type fine-grain molybdenum tube target of the present disclosure, the purity of the molybdenum powder is greater than 99.95%.

In the present disclosure, the tube target is made of a molybdenum material. The properties of molybdenum are very similar to the properties of tungsten. However, the floating point and conductive property of molybdenum are outstanding and the coefficient of linear thermal expansion is small, and therefore, the processing of molybdenum is easier than the processing of tungsten. The thermal conductivity [135 W/(m·K)] and the specific heat [0.276 KJ(Kg·K)] of molybdenum indicate an optimal matching; the melting point is 2620° C.; the strength and density of molybdenum are greater than those of tungsten; molybdenum still has high strength at 1200° C.; and molybdenum has the capacity twice as the capacity of tungsten.

Under the temperature and pressure of a working vacuum furnace, molybdenum has a very low vapor pressure. Therefore, molybdenum has minimum pollution to the working or working substances in the furnace, and the evaporation loss would not restrict the service life of high-temperature molybdenum parts such as a heating element and a thermal insulation package.

In the present disclosure, during the process of using a molybdenum spin-coated sputtering tube target for sputtering coating, the tube target is of fine-grain structures and of good compactness, and therefore, when bombardment is performed on the sputtering target, the following defect of adopting a tungsten tube target is overcome: the phenomenon of reduced film quality caused by the spattering of large-sized target particles or microparticles that is caused by sudden release of air in pores inside the target, or the spattering of microparticles that is caused when secondary electron bombardment is performed on a film after the film is formed.

Upon experiments, it is proved that during the sputtering, target atoms would be easily preferentially sputtered out along the most compact arrangement direction of six directions of the atoms. In order to achieve the maximum sputtering rate, people usually adopt methods for increasing the sputtering rate to realize effects. One of the means adopted in the present disclosure is changing coarse-grain structures to fine-grain structures, so as to increase the sputtering rate (the crystallization direction of a target also has a relatively substantial effect on the uniformity of thickness of a sputtered film layer). Therefore, obtaining a target structure of a certain crystallization orientation is vital to a sputtering process of a film. In addition, the present disclosure uses molybdenum powder with the purity being greater than 3N, and the prepared tube target is of an increased length (the length is 1700-2700 mm), an increased diameter (the diameter is greater than 150 mm), and a decreased wall thickness (the wall thickness is 15-40 mm), and using the product can substantially improve the efficiency of coating a substrate of a photovoltaic element and ensure the service life of the product.

With the present disclosure, impedance ratio and film stress requirements of a material for a solar photovoltaic product are met, and grains of molybdenum are enabled to form fine-grain structures during forging processing, thereby remarkably improving the uniformity and layout quality of a film of a glass substrate in the LED industry and prolonging the service life of a liquid crystal display element.

In the present disclosure, on the basis of the feature of the high strength of molybdenum powder, a mold is adopted to prepare a hollow powder molybdenum tube blank from molybdenum power, thereby changing the molding process of extruding or drawing at abroad.

In the present disclosure, when a molded blank is sintered, a temperature decreasing process is cancelled (particularly a water circulation temperature decreasing process). Upon study, it is discovered that a temperature decreasing process can destroy the formation of fine-grain structures of a material. Directly forging after high-temperature sintering can keep the formation of fine-grain structures, and the effects produced by the process are unpredictable in advance.

In the present disclosure, a forging process is changed. Prior forging relates to directly forging the surface of a tube target and has the defects of un-uniform forging, an uncontrollable deformation amount, poor product quality, a low qualified rate, and easy destroy of crystals of the tube target. The present disclosure places a tube blank into a mold and directly forges the mold, so as to effectively control the deformation amount of a tube target (the deformation amount of the present disclosure is controlled to be less than 50%), thereby avoiding the destroy of fine-grain structures, remarkably improving product performances, and realizing a qualified rate of 100%.

In the present disclosure, an annealing process is changed. The prior annealing adopts low-temperature (450-500° C.). Upon study, it is discovered that low-temperature annealing substantially destroys fine-grain structures of molybdenum and fails to ensure the product quality. The annealing temperature of the present disclosure adopts 1000-1200° C., which remarkably improves the formation and stability of fine-grain structures, and remarkably improves the quality and life of products. The effects of the process are unpredictable in advance.

The molybdenum tube target of the present disclosure, as compared with the tungsten tube target, has higher strength and density. When the product is used for LED coating, the uniformity and layout quality of a film can be improved for two or more times.

Beneficial Effects of the Present Disclosure:

First, the present disclosure overcomes the defect that it is unable to use a pure molybdenum material to prepare a tube target (in the prior art, a metal molybdenum alloy or a synthesized molybdenum material is usually adopted), makes a great change in material selection, uses a molybdenum material instead of a tungsten material to prepare the tube target, and combines with the change of processes, thereby enabling the tube target to be a molybdenum tube target with fine-grain structures and improving the quality of the tube target.

Second, the present disclosure overcomes the defect that in the prior art, only a tube target with the length being less than 1700 mm can be produced, increases the length of a tube target to 1700-2700 mm, increases the diameter to be greater than 150 mm, and decreases the wall thickness to be 15-40 mm, and the usage of the product can remarkably improve the efficiency of coating a substrate of a photovoltaic element.

Third, the present disclosure overcomes the defect of the difficulties of sintering, solves the prior problem that using water circulation to decrease temperature is needed after sintering, omits a temperature decreasing process in a high-temperature sintering process, and adopts directly forging after the high-temperature sintering, which is beneficial to the increase of the compactness of a material and the formation of fine-grain structures.

Fourth, the present disclosure overcomes the defects of poor compactness of a forging process and un-uniformity of the forging, and changes direct forging the surface of a tube blank during a forging process in the prior art to a process of feeding a tube blank into a mold and forging the mold, thereby effectively controlling the deformation amount of the forging to be less than 50%, effectively accelerating the formation of fine-grain structures, and improving the quality.

Fifth, the present disclosure overcomes the defects of un-uniformity of annealing after forging molding and a stress change caused by low-temperature annealing, changes prior low-temperature annealing (450-500° C.) to high-temperature annealing (1000-1300° C.), thereby remarkably ensuring the properties of a material under an annealing condition and effectively stabilizing the high strength and density of the material at 1200° C. After fine-grain structures are formed, it is ensured that molybdenum has a very low vapor pressure under the temperature and pressure of a working vacuum furnace. Therefore, molybdenum has minimum pollution to the working or working substances in the furnace, and the evaporation loss would not restrict the service life of high-temperature molybdenum parts such as a heating element and a thermal insulation package.

Sixth, the present disclosure relates to simple processes, easy industrial production and control, and reduced pollution.

Seventh, the present disclosure reduces the production cost, improves the quality, and remarkably improves the production efficiency.

DETAILED DESCRIPTION

Figure 1:
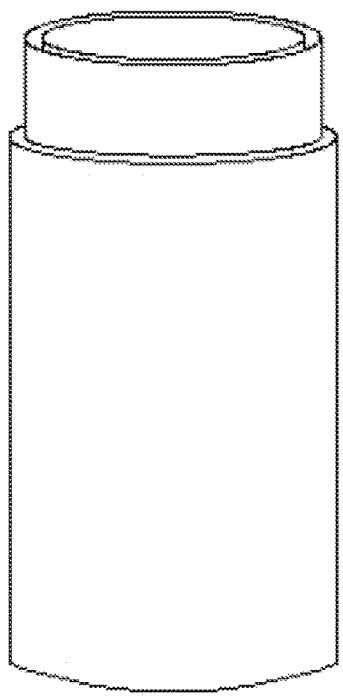
FIG. 1 is a schematic diagram of a product prepared according to the present disclosure.
Figure 2:
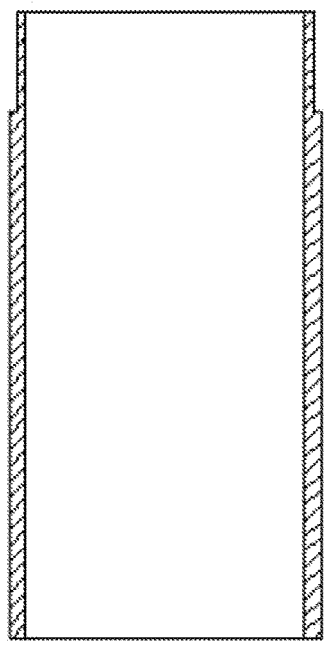
FIG. 2 is a structural cutaway diagram of the present disclosure.

A method for preparing an ultra-long-tube type fine-grain molybdenum tube target uses molybdenum powder with the purity being greater than 3N to prepare a target tube with a uniform wall thickness, where the length is 1700-2700 mm; the diameter is greater than 150 mm; and the wall thickness is 15-40 mm. The preparation method includes:

(1) taking molybdenum powder having a granularity of 2.8-3.8 mm, feeding the molybdenum powder into a film prepared in advance, molding by static pressing under 160-200 Mpa, placing in a medium frequency furnace, sintering for 55-65 h under hydrogen protection at 1900-2000° C., sintering to form a tube blank, keeping the temperature, and reserving for use;

(2) taking the sintered tube blank from the medium frequency furnace, placing into a mold prepared in advance, controlling the temperature of the tube blank to be 1350° C., forging the mold of a tube target, controlling the deformation amount of the tube blank to be less than 50% during the forging, and forging to form a tube target with the length being 1700-2700 mm, the diameter being greater than 150 mm, and the wall thickness being 15-40 mm;

(3) taking the tube target formed by forging, placing in a tempering furnace of 1000-1200° C., annealing for 1-3 h, and stabilizing formed fine-grain structures; and (4) performing fine processing on the tube target, then washing, and drying to prepare the fine-grain molybdenum tube target.

In the method for preparing an ultra-long-tube type fine-grain molybdenum tube target of the present disclosure, the sintering may be vacuum sintering, and the method for controlling the temperature of the vacuum sintering is: gradually increasing the temperature from 0° C. to 2000° C.

In the method for preparing an ultra-long-tube type fine-grain molybdenum tube target of the present disclosure, the purity of the molybdenum powder is greater than 99.95%.

Embodiment 1

A method for preparing an ultra-long-tube type fine-grain molybdenum tube target uses molybdenum powder with the purity being greater than 3N to prepare a target tube with a uniform wall thickness, where the length is 1700 mm; the diameter is greater than 150 mm; and the wall thickness is 15 mm. The preparation method includes:

(1) taking molybdenum powder having a granularity of 2.8-3.8 mm, feeding the molybdenum powder into a film prepared in advance, molding by static pressing under 160 Mpa, placing in a medium frequency furnace, sintering for 65 h under hydrogen protection at 1900° C., sintering to form a tube blank, keeping the temperature, and reserving for use;

(2) taking the sintered tube blank from the medium frequency furnace, placing into a mold prepared in advance, controlling the temperature of the tube blank to be 1350° C., forging the mold of a tube target, controlling the deformation amount of the tube blank to be less than 50% during the forging, and forging to form a tube target with the length being 1700 mm, the diameter being greater than 150 mm, and the wall thickness being 15 mm;

(3) taking the tube target formed by forging, placing in a tempering furnace of 1000° C., annealing for 3 h, and stabilizing formed fine-grain structures; and (4) performing fine processing on the tube target, then washing, and drying to prepare the fine-grain molybdenum tube target.

Embodiment 2

A method for preparing an ultra-long-tube type fine-grain molybdenum tube target uses molybdenum powder with the purity being greater than 3N to prepare a target tube with a uniform wall thickness, where the length is 2000 mm; the diameter is greater than 150 mm; and the wall thickness is 25 mm. The preparation method includes:

(1) taking molybdenum powder having a granularity of 2.8-3.8 mm, feeding the molybdenum powder into a film prepared in advance, molding by static pressing under 180 Mpa, placing in a medium frequency furnace, sintering for 60 h under hydrogen protection at 1950° C., sintering to form a tube blank, keeping the temperature, and reserving for use;

(2) taking the sintered tube blank from the medium frequency furnace, placing into a mold prepared in advance, controlling the temperature of the tube blank to be 1350° C., forging the mold of a tube target, controlling the deformation amount of the tube blank to be less than 50% during the forging, and forging to form a tube target with the length being 2000 mm, the diameter being greater than 150 mm, and the wall thickness being 25 mm;

(3) taking the tube target formed by forging, placing in a tempering furnace of 1100° C., annealing for 2 h, and stabilizing formed fine-grain structures; and (4) performing fine processing on the tube target, then washing, and drying to prepare the fine-grain molybdenum tube target.

Embodiment 3

A method for preparing an ultra-long-tube type fine-grain molybdenum tube target uses molybdenum powder with the purity being greater than 3N to prepare a target tube with a uniform wall thickness, where the length is 2700 mm; the diameter is greater than 150 mm; and the wall thickness is 40 mm. The preparation method includes:

(1) taking molybdenum powder having a granularity of 2.8-3.8 mm, feeding the molybdenum powder into a film prepared in advance, molding by static pressing under 200 Mpa, placing in a medium frequency furnace, sintering for 55 h under hydrogen protection at 2000° C., sintering to form a tube blank, keeping the temperature, and reserving for use;

(2) taking the sintered tube blank from the medium frequency furnace, placing into a mold prepared in advance, controlling the temperature of the tube blank to be 1350° C., forging the mold of a tube target, controlling the deformation amount of the tube blank to be less than 50% during the forging, and forging to form a tube target with the length being 2700 mm, the diameter being greater than 150 mm, and the wall thickness being 40 mm;

(3) taking the tube target formed by forging, placing in a tempering furnace of 1200° C., annealing for 1 h, and stabilizing formed fine-grain structures; and (4) performing fine processing on the tube target, then washing, and drying to prepare the fine-grain molybdenum tube target.

What is claimed is:

1. A method for preparing an ultra-long-tube type fine-grain molybdenum tube target, wherein the length of the ultra-long-tube type fine-grain molybdenum tube target is 1700-2700 mm; the diameter of the ultra-long-tube type fine-grain molybdenum tube target is greater than 150 mm; and a wall thickness of the ultra-long-tube type fine-grain molybdenum tube target is 15-40 mm; the method uses molybdenum powder with the purity being greater than 3N to prepare the tube target, wherein the wall thickness of the tube target is uniform, comprising:

(1) taking molybdenum powder having a granularity of 2.8-3.8 mm, feeding the molybdenum powder into a film prepared in advance, molding by static pressing under 160-200 Mpa, placing the molybdenum powder in a medium frequency furnace, sintering for 55-65 h under hydrogen protection at 1900-2000° C., sintering to form a tube blank, keeping the temperature, and reserving for use;

(2) taking the sintered tube blank from the medium frequency furnace, placing into a mold prepared in advance, controlling the temperature of the tube blank to be 1350° C., forging the mold of the tube target, controlling the deformation amount of the tube blank to be less than 50% during the forging, and forging to form the tube target with the length being 1700-2700 mm, the diameter being greater than 150 mm, and the wall thickness being 15-40 mm;

(3) taking the tube target formed by forging, placing in a tempering furnace of 1000-1200° C., annealing for 1-3 h, and stabilizing fine-grain structures; and (4) performing fine processing on the tube target, washing, and drying to prepare the fine-grain molybdenum tube target.

2. The method for preparing an ultra-long-tube type fine-grain molybdenum tube target according to claim 1, wherein the sintering is vacuum sintering, and the temperature is increased from 0° C. to 2000° C. during the vacuum sintering.

3. The method for preparing an ultra-long-tube type fine-grain molybdenum tube target according to claim 1, wherein the purity of molybdenum powder is greater than 99.95%.

* * * * *